(12) United States Patent
Brown et al.

(10) Patent No.: US 9,123,613 B2
(45) Date of Patent: *Sep. 1, 2015

(54) IMAGE SENSOR AND DISPLAY

(75) Inventors: Christopher James Brown, Lockerbie (GB); Ben James Hadwen, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 1827 days.

This patent is subject to a terminal disclaimer.

(21) Appl. No.: 12/303,567

(22) PCT Filed: Jun. 11, 2007

(86) PCT No.: PCT/JP2007/062184
§ 371 (c)(1),
(2), (4) Date: Dec. 5, 2008

(87) PCT Pub. No.: WO2007/145346
PCT Pub. Date: Dec. 21, 2007

(65) Prior Publication Data
US 2010/0238135 A1    Sep. 23, 2010

(30) Foreign Application Priority Data

Jun. 12, 2006 (GB) .................................. 0611537.2

(51) Int. Cl.
*H04N 5/335* (2011.01)
*H01L 27/146* (2006.01)
(Continued)

(52) U.S. Cl.
CPC ........ *H01L 27/14678* (2013.01); *G06F 3/0412* (2013.01); *H01L 27/14632* (2013.01); *H01L 27/14643* (2013.01); *H04N 3/155* (2013.01); *H04N 5/335* (2013.01); *H04N 5/374* (2013.01);
(Continued)

(58) Field of Classification Search
None
See application file for complete search history.

(56) References Cited

U.S. PATENT DOCUMENTS 4,746,804 A    5/1988    Kitamura et al.
4,797,546 A    1/1989    Berger et al.
(Continued)

FOREIGN PATENT DOCUMENTS

EP    0 490 683 A2    6/1992
EP    1 085 751 A2    3/2001
(Continued)

OTHER PUBLICATIONS

Co-pending U.S. Appl. No. 12/303,794, filed Dec. 8, 2008.
(Continued)

*Primary Examiner* — K. Wong
(74) *Attorney, Agent, or Firm* — Renner, Otto, Boisselle & Sklar, LLP

(57) ABSTRACT

An image sensor, for example for incorporation within an active matrix display, comprises an array of sensor elements 10. Each sensor element (10) comprise an amplifying transistor (M1) whose gate is connected to an integrating node (11). The integrating node (11) is connected to one plate of an integrating capacitor (C1) and to one electrode of a photodiode (D1), whose other electrode is connected to a resetting line (RST). The sensor element (10) performs a repeating sensing cycle comprising a resetting phase, an integrating phase and a reading phase. During the resetting phase, the resetting line (RST) receives a voltage which forward-biases the photodiode (D1) so as to charge the integrating node (11) to a predetermined voltage. The resetting line (RST) is then returned to a voltage for reverse-biasing the photodiode (D1) so that the integrating and reading phases may be performed.

27 Claims, 13 Drawing Sheets

(51) Int. Cl.

| | | |
|---|---|---|
| *G06F 3/041* | (2006.01) | |
| *H04N 3/14* | (2006.01) | |
| *H04N 5/374* | (2011.01) | |
| *G02F 1/1333* | (2006.01) | |
| *G02F 1/1362* | (2006.01) | |
| *G09G 3/36* | (2006.01) | |

(52) U.S. Cl.
CPC ........... *G02F 1/1362* (2013.01); *G02F 1/13338* (2013.01); *G09G 3/3648* (2013.01); *G09G 2360/14* (2013.01)

(56) References Cited

U.S. PATENT DOCUMENTS

| | | | |
|---|---|---|---|
| 5,043,785 | A | 8/1991 | Mizutani et al. |
| 5,376,782 | A | 12/1994 | Ikeda et al. |
| 5,471,515 | A | 11/1995 | Fossum et al. |
| 5,705,807 | A | 1/1998 | Throngnumchai et al. |
| 5,719,626 | A | 2/1998 | Yoneyama et al. |
| 5,942,774 | A | 8/1999 | Isogai et al. |
| 6,163,023 | A | 12/2000 | Watanabe |
| 6,384,413 | B1 | 5/2002 | Pain |
| 6,489,631 | B2 * | 12/2002 | Young et al. ..................... 257/59 |
| 7,211,880 | B2 * | 5/2007 | Izumi ............................. 257/678 |
| 7,242,145 | B2 | 7/2007 | Young |
| 7,242,449 | B1 | 7/2007 | Yamazaki et al. |
| 7,329,848 | B2 * | 2/2008 | Shin ........................ 250/214 SW |
| 7,453,424 | B2 * | 11/2008 | Johnson et al. .................. 345/76 |
| 7,663,080 | B2 * | 2/2010 | Tsai ............................. 250/205 |
| 7,773,068 | B2 * | 8/2010 | Nakamura et al. ............ 345/104 |
| 7,773,078 | B2 * | 8/2010 | Lee et al. ...................... 345/207 |
| 2002/0139981 | A1 | 10/2002 | Young |
| 2003/0011694 | A1 | 1/2003 | Dierickx |
| 2003/0080340 | A1 | 5/2003 | Henderson et al. |
| 2003/0164441 | A1 | 9/2003 | Lyon et al. |
| 2004/0008172 | A1 | 1/2004 | Nakamura et al. |
| 2004/0191687 | A1 | 9/2004 | Fukuzawa et al. |
| 2005/0104877 | A1 | 5/2005 | Nakamura et al. |
| 2005/0116937 | A1 | 6/2005 | Choi et al. |
| 2005/0212916 | A1 | 9/2005 | Nakamura et al. |
| 2006/0011913 | A1 | 1/2006 | Yamazaki |
| 2006/0033729 | A1 | 2/2006 | Yoshida et al. |
| 2006/0192766 | A1 | 8/2006 | Nakamura et al. |
| 2007/0109286 | A1 | 5/2007 | Nakamura et al. |
| 2008/0129653 | A1 | 6/2008 | Yamazaki |

FOREIGN PATENT DOCUMENTS

| | | |
|---|---|---|
| GB | 2 332 049 | 6/1999 |
| JP | 64-50460 | 2/1989 |
| JP | 05-276442 A | 10/1993 |
| JP | 8-293591 A | 11/1996 |
| JP | 09-247536 | 9/1997 |
| JP | 10-093066 A | 4/1998 |
| JP | 10-093070 A | 4/1998 |
| JP | 11-177996 A | 7/1999 |
| JP | 2001-109394 A | 4/2001 |
| JP | 2002-314756 | 10/2002 |
| JP | 2004-318067 | 11/2004 |
| JP | 2004-319067 A | 11/2004 |
| JP | 2004-325961 A | 11/2004 |
| JP | 2006-065305 A | 3/2006 |
| KR | 10-2005-0052674 A | 6/2005 |

OTHER PUBLICATIONS

Tada et al., "A Touch Panel Function Integrated LCD Using LTPS Technology", IDW, Proceedings of the International Display Workshops, Jan. 1, 2004, pp. 349-350, XP003000288.

Gruev et al., "Two Transistor Current Mode Active Pixel Sensor", Circuits and Systems, IEEE International Symposium, May 1, 2007, pp. 2846-2849.

International Search Report for International Application No. PCT/JP2007/062186 mailed Sep. 25, 2007.

British Search Report for UK Application No. GB0611536.4 dated Oct. 19,2006.

European Search Report for European Application No. 07745440.3 dated Jul. 6, 2009.

European Search Report for corresponding Application No. 07745438.7 dated Jul. 6, 2009.

International Search Report for corresponding Application No. PCT/JP2007/062184 mailed Sep. 18, 2007.

British Search Report for corresponding Application No. GB0611537.2 dated Sep. 25, 2006.

E. Fossum et al., "128x128 CMOS photodiode-type active pixel sensor with on-chip timing, control, and signal chain electronics", Charged-Coupled Devices and Solid-State Optical Sensors V, Proc. SPIE vol. 2415, pp. 117-123, 1995).

"ISSCC2007/Session 7/Display Electronics/7.2", 2007 IEEE International Solid-State Circuits Conference, Feb. 12, 2007, pp. 132-133 and 592).

Office Action mailed Aug. 25, 2011 in copending U.S. Appl. No. 12/303,794.

* cited by examiner

RST:

RS:

IMAGE SENSOR AND DISPLAY

TECHNICAL FIELD

The present invention relates to an image sensor and to a display including such an image sensor.

BACKGROUND ART

There is a desire to fabricate an image sensor in a thin-film polysilicon process which is compatible with that used in the manufacture of thin-film transistor substrates for active matrix liquid crystal displays (AMLCDs). By using such a fabrication process, such an image sensor may be monolithically integrated within an AMLCD in order to provide, for example, an input function for detecting a touch or pen input. In such an arrangement, each pixel may include both image sensing and displaying elements to provide similar spatial resolutions of image sensing and display. However, the presence of the image sensing function within the pixels reduces the aperture ratio of such a display as compared with a display in which no image sensing function is provided.

Several types of semiconductor image sensors exist, including those based on charge-coupled device (CCD) technology and those based on complementary metal oxide silicon (CMOS) technology. CCDs have historically offered higher quality performance than CMOS image sensors because of the specialised process technologies for maximising the transfer efficiency of photo-generated charges. However, CMOS image sensors have an advantage in that both an imaging array and signal processing electronics may be integrated onto the same chip whereas the specialised nature of CCD processes prohibits such integration. CMOS image sensors therefore have advantages of lower cost for many applications, for example in consumer electronics.

Two main types of CMOS image sensors are known, namely passive pixel sensors (PPS) and active pixel sensors (APS). Passive pixel sensors include a photodiode or similar photo sensitive device and a "select" transistor within each pixel of the image sensor. An image sensor array is addressed by row and the current generated by each photodiode is integrated for the duration of one row period by an integrator located typically at the bottom of each column. Because each pixel contains only two active devices, passive pixel arrangements permit a high resolution array to be provided. However, the size of such an array is limited by the time needed to integrate each row sequentially and the output signals suffer from a relatively large degree of noise associated with fluctuations in the column current during integration.

APS devices include an amplifier in each pixel and so do not suffer from the limitations of PPS arrangements. FIG. 1 of the accompanying drawings illustrates an example of an APS with a photogate-based pixel circuit, for example as disclosed in U.S. Pat. No. 5,471,515. In operation, during an integration period, electrons accumulate in a potential well beneath a photogate 30 in proportion to a photon flux incident on a substrate beneath the photogate electrode. At the end of each integration period, the potential of a floating diffusion region 40 is reset to an initial level by applying a resetting signal pulse RST. The charge accumulated on the photogate is then transferred to the floating diffusion region 40 during a transfer step controlled by a pulse TX. The potential of the floating diffusion region 40 is thus indicative of the charge accumulated during the integration period.

When a row of pixels is sampled, a row select transistor 60 is turned on by a row scan pulse (ROW). A transistor 55 is connected as a source-follower cooperating with a bias transistor 65 disposed at the end of a column of the pixel array. The gate of the transistor 55 is connected to a floating diffusion node so that the output of the source-follower provides an indication of the voltage at the gate of the transistor 55 and hence of the charge accumulated in the pixel during the integration period.

The image sensor chip also comprises circuitry for reading out the sampled pixel signal as illustrated at 70 in FIG. 1. When the row containing the sensing element is selected, the source follower output voltage representing the incident light intensity is stored in a capacitor 205 via a transistor 200. Transistors 210, 215 and 220 form another source-follower for the column containing the sensing element. When the column select signal COL is pulsed, the output of the column source-follower is supplied to a chip amplifier via an output OUT. The column source-followers are enabled in turn so that the image sensor output voltage is a time-sequential representation of the light intensity incident on each pixel of the array.

The arrangement shown in FIG. 1 also comprises devices 116, 225, 230, 235, 240 and 245 which are used to generate a reference voltage for the chip amplifier for reducing offset errors. The operation of such an arrangement is known and will not be described further.

FIG. 2 of the accompanying drawings illustrates a sensor element of the APS type including a photodiode 1 of the "bulk" or vertical type, for example as disclosed in "128×128 CMOS photodiode-type active pixel sensor with on-chip timing, control, and signal chain electronics", E Fossum et al, Charge-Coupled Devices and Solid-State Optical Sensors V, Proc. SPIE, Vol 2415, pp 117-123, 1995. The sensing element comprises a resetting transistor 2 connected between a supply line VDD and the cathode 3 of the photodiode 1. The gate of the transistor 2 receives a reset signal RST and reverse-biases the photodiode 1 so as to charge its capacitance to a predetermined voltage. The reset phase is followed by a sensing phase during which integration is performed whereby the photodiode current discharges its capacitance at a rate proportional to the photon flux incident on the photodiode 1. A transistor 4 is connected as a source-follower with its source-drain or "main conduction" path connected in series with that of a selecting transistor 5 between the supply line VDD and a column buss COL BUS 6 of a sensing element array. When a row of pixels is sampled, the row select transistor 5 is turned on by a pulse RS. The column bus is connected to a column reading arrangement, for example of the type illustrated by the transistor 65 and the circuit 70 in FIG. 1, to allow the output voltages from the row of pixels to be read out of the sensor.

US 2006/0033729 A1 discloses a device comprising an image sensor integrated within an AMLCD as illustrated in FIG. 3 of the accompanying drawings. Each pixel comprises a display portion and an image sensing portion with the latter being of a type similar to that shown in FIG. 2 of the accompanying drawings. In this device, each photodiode comprises a thin-film photodiode fabricated using the same process technology as used for manufacture of the AMLCD thin-film transistor (TFT) substrate. A separate integration capacitor is required in this case because the ratio of the photocurrent to self-capacitance of the thin-film photodiode is large compared to that for a bulk CMOS device. Thus, in the absence of the integration capacitance, the pixel discharge rate would be too high for practical use.

Such a device may be operated in shadow mode or reflection mode. In shadow mode, objects above the AMLCD block the path of ambient light and cast a shadow on the surface of the display, which shadow is detected by the image sensor array. This mode may be used, for example, for touch, pen or gesture input. In reflection mode as illustrated in FIG. 4 of the accompanying drawings, light from a display backlight 23 passes through a counter-substrate 24, a liquid crystal layer 25 and a TFT substrate 21 so as to be incident on an object 22 in front of the device. Light reflected from the object 22 returns to the image sensor array for conversion into a corresponding signal. Examples of applications for the reflection mode include contact-type image scanning and fingerprint recognition and identification.

DISCLOSURE OF INVENTION

According to a first aspect of the invention, there is provided an image sensor comprising at least one sensor element, the or each of which comprises a semiconductor amplifying element, an integrating capacitor, and a photodiode having a first electrode, which is connected to a first control electrode of the amplifying element and a first terminal of the capacitor, and a second electrode connected to a first control input, which is arranged to receive, during a sensing phase, a first voltage for reverse-biasing the photodiode and to receive, during a resetting phase, a second voltage for forward-biasing the photodiode so as to charge the capacitor to a predetermined voltage.

The resetting and sensing phases may be repeated cyclically.

The photodiode may be a lateral photodiode.

The photodiode may be a thin film diode.

The amplifying element may comprise a voltage-follower arrangement.

The amplifying element may comprise a first transistor. The first transistor may be a thin-film transistor. The first transistor may be a field effect transistor. The first transistor may be connected as a source-follower and the first control electrode may comprise the transistor gate.

The sensor may comprise a semiconductor selection element having a main conduction path connected in series with that of the amplifying element and a second control electrode connected to a second control input for controlling selection of the sensor element during a reading phase. The selection element may comprise a second transistor. The second transistor may be a thin-film transistor.

The capacitor may have a second terminal connected to a second control input, which is arranged to receive, during the sensing phase, a third voltage for disabling the amplifying element and for permitting integration by the capacitor of a photocurrent from the photodiode and to receive, during a reading phase, a fourth voltage for enabling the amplifying element.

The at least one sensor element may comprise a plurality of sensor elements arranged as a first array comprising rows and columns. The sensor may comprise first row control inputs, each of which is connected to the first control inputs of the sensor elements of a respective row. The sensor may comprise second row control inputs, each of which is connected to the second control inputs of the sensor elements of a respective row. The sensor may comprise column outputs, each of which is connected to outputs of the sensor elements of a respective column. Each column output may be connected to a respective biasing element. Each biasing element may comprise a third transistor. Each third transistor may be a thin film transistor.

The sensor may comprise an active matrix addressing arrangement for addressing the sensor elements.

According to a fourth aspect of the invention, there is provided a display comprising a sensor according to the first aspect of the invention and at least one display pixel.

The at least one pixel may comprise a plurality of pixels arranged as a second array comprising a plurality of the rows and a plurality of the columns. Each of the sensor elements may form part of at least one pixel. The display may comprise pixel column data lines, at least two of which connect the column outputs to the sensor element outputs of the respective columns of sensor elements.

The pixels may be liquid crystal pixels.

The active matrix addressing arrangement may be arranged to address each row of sensor elements during a line blanking period of a corresponding row of pixels.

It is thus possible to provide an image sensor in which each sensor element occupies a reduced area as compared with known arrangements. This may be used, for example, to provide increased "packing density" of sensing elements to provide a sensor of increased spatial resolution. In the case of a combined sensor and display, the sensor elements are of reduced area so that, for a given spatial resolution, a greater portion of pixel area may be used for display purposes, for example to provide a brighter display of improved appearance. For example, such arrangements may be used in devices manufactured using thin-film semiconductor process or silicon-on-insulator (SOI) semiconductor process technologies. In the case of sensors combined with displays, the aperture ratio, for example of AMLCDs with integrated image sensing, may be substantially increased.

BRIEF DESCRIPTION OF DRAWINGS

Like reference numerals refer to like parts throughout the drawings.

BEST MODE FOR CARRYING OUT THE INVENTION

Figure 5:
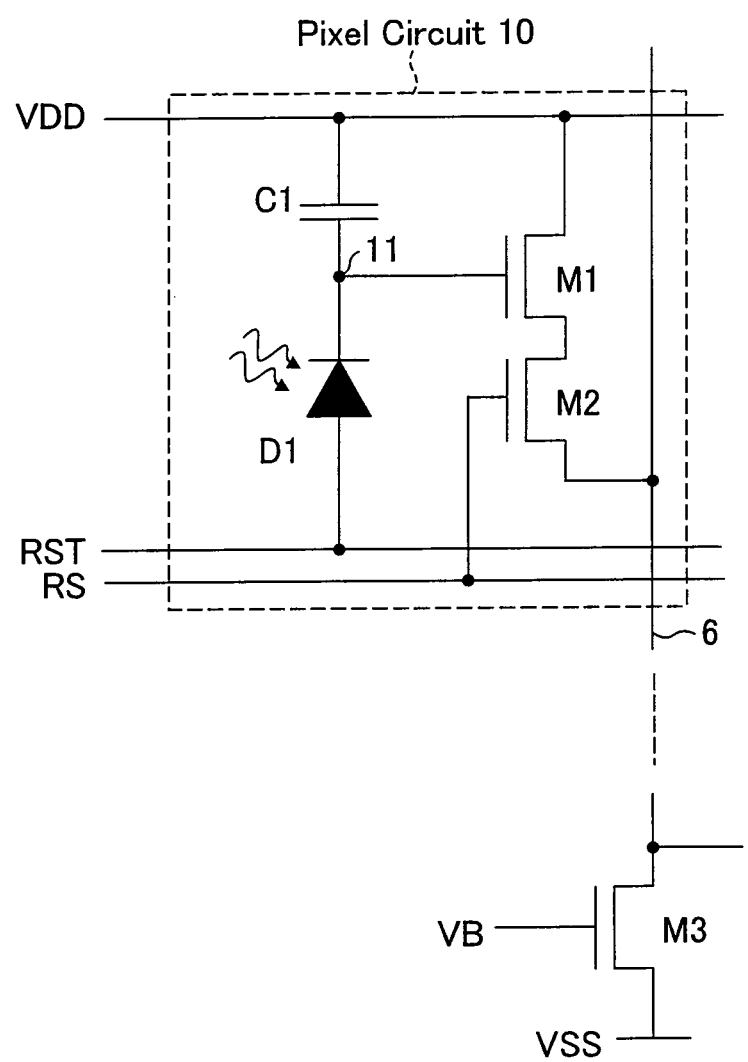
FIG. 5 is a circuit diagram of part of an image sensor constituting an embodiment of the invention.

An image sensor comprises an array of rows and columns of sensor elements, each of which is as illustrated at in FIG. 5.

The sensor elements 10 together with addressing and output circuits are integrated on a common substrate, for example using thin-film transistor or silicon-on-insulator techniques. The sensor comprises an active matrix device, which may be combined with an active matrix display of the liquid crystal type as described hereinafter.

The sensor element 10 comprises a photodetector in the form of a lateral thin-film photodiode D1. The anode of the photodiode D1 is connected to a reset line RST which is common to all of the sensor elements in the same row. The cathode of the photodiode D1 is connected to an integrating node 11, which is connected to the first electrode or plate of an integrating capacitor C1, whose other electrode or plate is connected to a supply line VDD.

The sensing element 10 comprises a semiconductor amplifying element in the form of a thin-film insulated gate field effect transistor M1 arranged as a source-follower with its gate connected to the cathode of the photodiode D1 and the first electrode of the capacitor C1, its drain connected to the supply line VDD, and its source providing an output signal. The source-drain path of the transistor M1 is connected in series with the source-drain path of another insulated gate field effect transistor M2 between the supply line VDD and a column output line 6. The gate of the transistor M2 is connected to a row select line RS, which is common to the sensor elements in the same row. The source of the transistor M2 forms an output of the sensing element 10 with the outputs of the sensing elements in the same column being connected to the same column output line 6.

Figure 1:
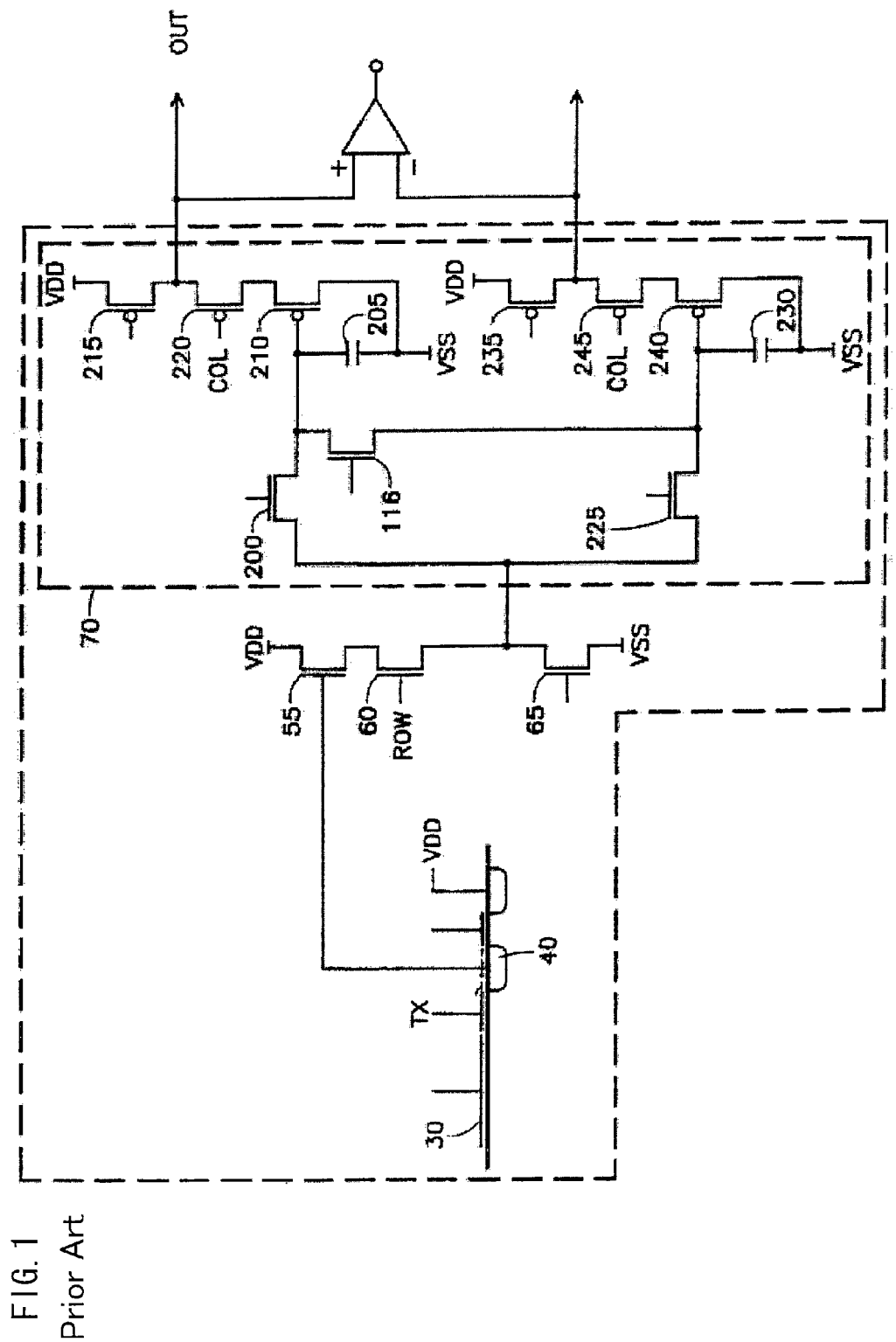
FIG. 1 is a schematic diagram of part of a known type of image sensor.
Figure 2:
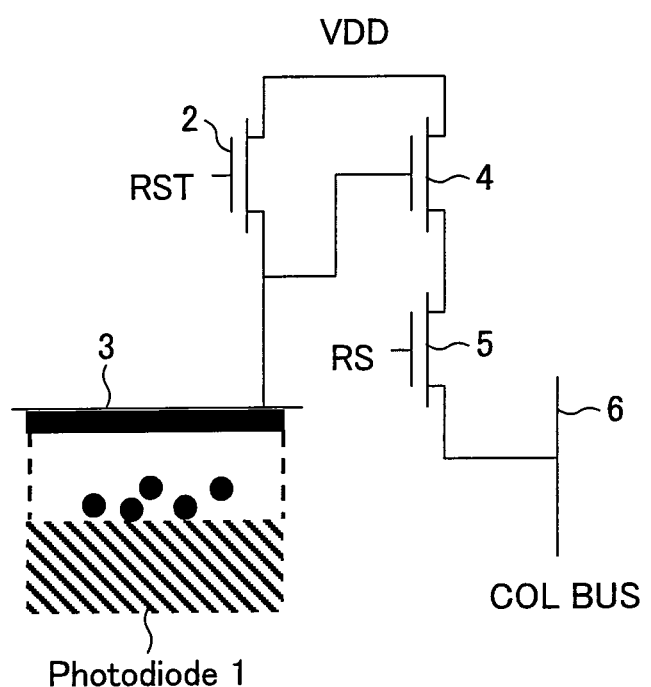
FIG. 2 is a circuit diagram of a known type of image sensing element.

The end of the column output line 6 is connected to the drain of an insulated gate field effect transistor M3, whose source is connected to another supply line VSS and whose gate is connected to a reference voltage generator via a reference voltage line VB. The transistor M3 acts as a biasing element forming an active source load for the transistor M1 of each sensor element 10 of the column currently selected for reading. The drain of the transistor M3 comprises the column output and is connected to an output reading circuit of any suitable type, for example of the type as described hereinbefore with reference to FIG. 1.

Each of the sensor elements 10 performs a repeating cycle of operation having various phases. At the start of a sensing phase which comprises an integration period, a pulse is supplied to the reset line RST so as to forward-bias the photodiode D1. The photodiode D1 thus conducts so as to set the voltage across the capacitor C1 to a predetermined initial value. For example, the voltage of the reset line RST is normally at $V_{SS}$, which is the voltage of the supply line VSS and is typically zero volts. The pulse has an amplitude equal to $V_{DD}$ so that the initial voltage across the capacitor C1 is equal to the supply line voltage $V_{DD}$ minus the forward voltage drop across the photodiode D1. Following resetting, the voltage of the reset line RST returns to the value $V_{SS}$ so that the photodiode D1 is reverse-biased.

During the integration period, the photodiode current discharges the integration capacitor C1 at a rate proportional to the photon flux incident on the photodiode. At the end of the integration period, the voltage across the capacitor C1 has fallen by an amount equal to the product of the photodiode current and the integration period time divided by the capacitance of the capacitor C1 (in parallel with the capacitance of the photodiode D1 and the gate capacitance of the transistor M1).

At the end of the integration period, a row select pulse is supplied to the row select line RS. The voltage supplied to the gate of the transistor M2 thus rises from below the transistor threshold voltage to above the transistor threshold voltage in order to switch on the transistor M2. The source of the transistor M1 is thus connected via the control line 6 to the drain of the bias transistor M3 to form a source-follower, which acts as a voltage-follower arrangement. The output voltage of the source-follower provides a measure of the photodiode current integrated during the integration period and hence of the intensity of light incident on the photodiode D1.

Figure 3:
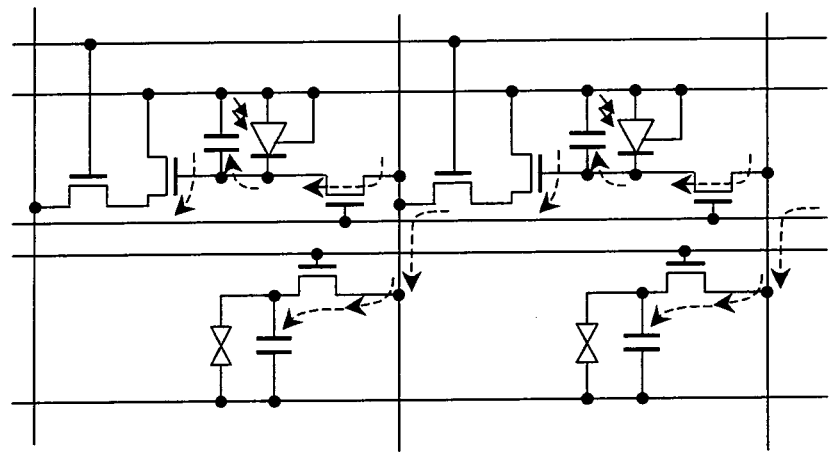
FIG. 3 is a circuit diagram of part of a known display incorporating an image sensor.

The sensor element 10 occupies less area than known arrangements while allowing the whole element to be formed using thin-film or silicon-on-insulator techniques. For example, the sensor element 10 of FIG. 5 requires only two transistors as compared with the three transistors required in the known arrangement shown in FIG. 3. This allows a low cost image sensor to be manufactured with more sensor elements per unit area to provide increased spatial resolution of image sensing. Alternatively, when the sensor forms part of a display, the area occupied by the sensor elements is reduced so that the aperture ratio of the display may be increased, for example as compared with the arrangement shown in FIG. 3. Thus, improved brightness and quality of display may be achieved as compared with known arrangements.

Figure 6:
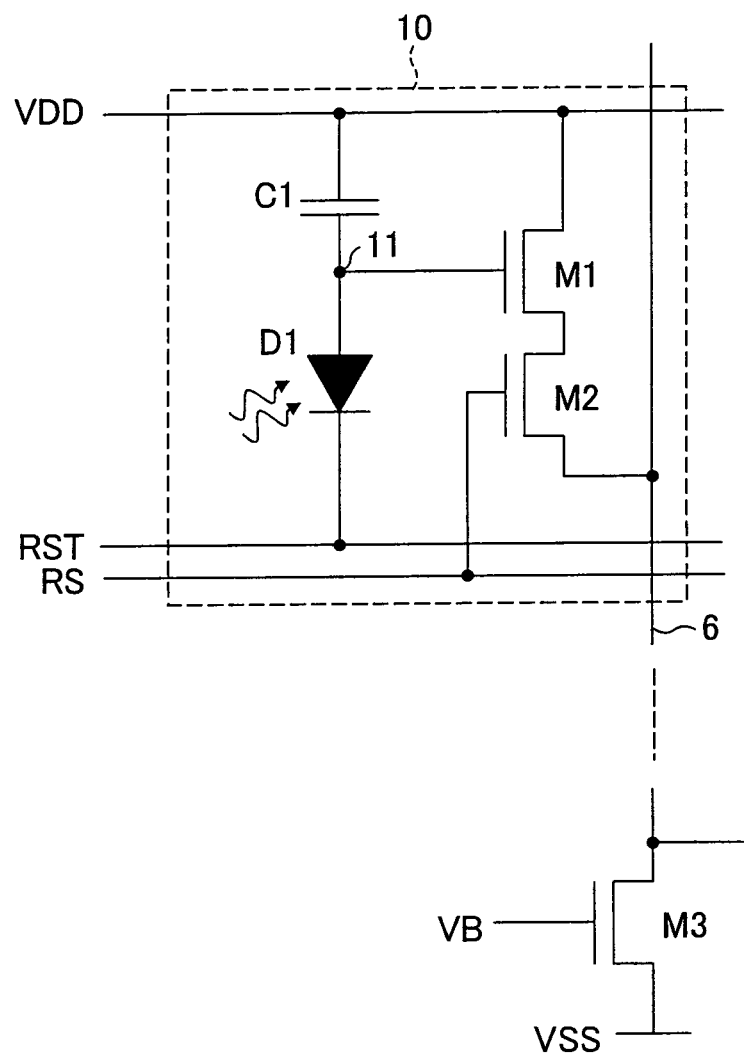
FIG. 6 is a circuit diagram illustrating a possible modification of the embodiment shown in FIG. 5.

The sensor element 10 shown in FIG. 6 differs from that shown in FIG. 5 in that the polarity of the photodiode D1 is reversed so that the cathode is connected to the reset line RST whereas the anode is connected to the integrating node 11. Also, the reset line RST normally carries the voltage $V_{DD}$ of the supply line VDD and a reset pulse causes this voltage to fall to the voltage $V_{SS}$ of the supply line VSS. The operation of the sensor element 10 is similar to the operation of the element shown in FIG. 5. However, during the reset phase, the potential of the integrating node formed by the first plate of the capacitor C1 is set to the voltage $V_{SS}$ plus the forward voltage drop across the photodiode D1 and rises during the integration period at a rate determined by the capacitance which is present at the integrating node 11 and by the photocurrent through the photodiode D1.

Figure 7:
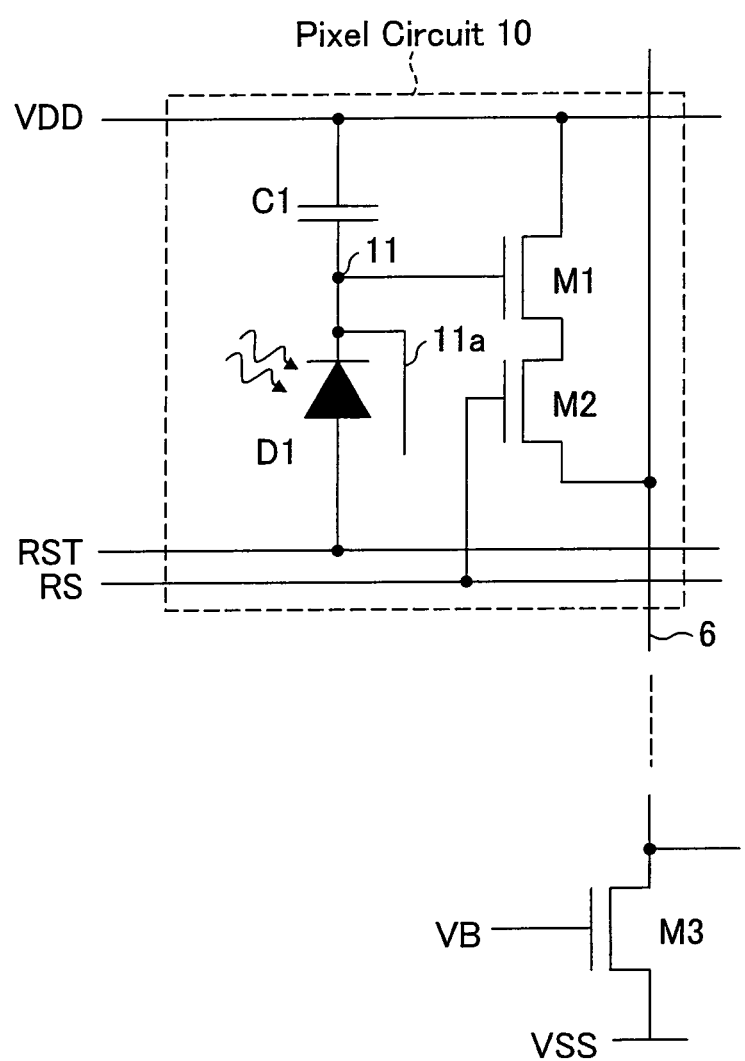
FIG. 7 is a circuit diagram illustrating another possible modification of the embodiment shown in FIG. 5.

FIG. 7 illustrates a modification to the sensor element of FIG. 5, which modification may also be applied to the sensor element FIG. 6. In particular, a light shield 11a is provided above the photodiode D1 and is connected to the integrating node 11 of the sensor element 10.

The use of such a light shield 11a is necessary, for example when the sensor element 10 is part of a display, such as an AMLCD. In such a case, the display substrate is transparent and exposed to a backlight in addition to the ambient light to be sensed. The light shield 11a may, for example, be fabricated in any suitable layer of a TFT process and is arranged to block light from the backlight entering a photosensitive region of the photodiode D1 so that substantially only the incident ambient light contributes to the photodiode current.

Figure 8:
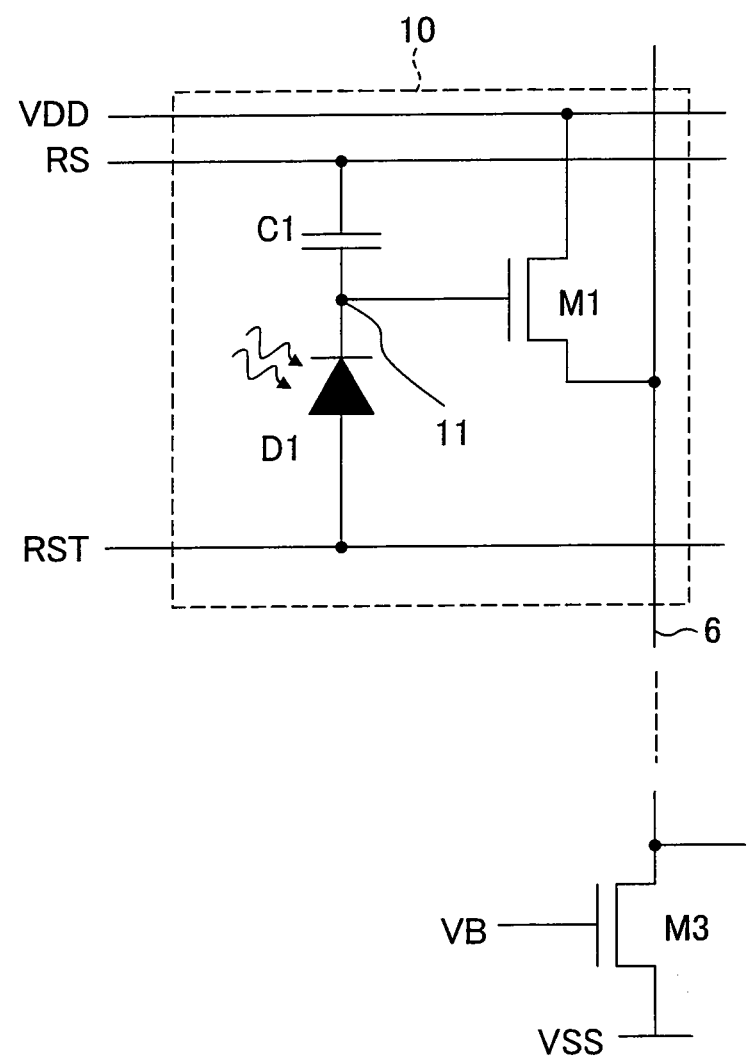
FIG. 8 is a circuit diagram of part of an image sensor constituting another embodiment of the invention.
Figure 9:
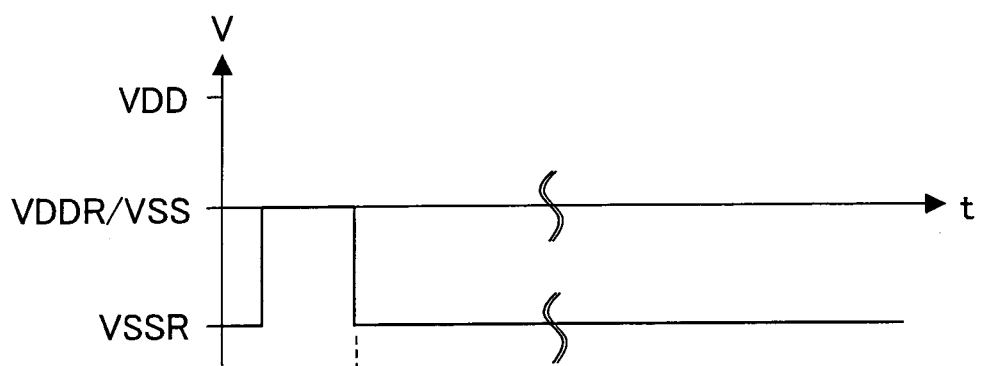
FIG. 9 is a timing diagram illustrating waveforms occurring in the embodiment shown in FIG. 8.
Figure 9:
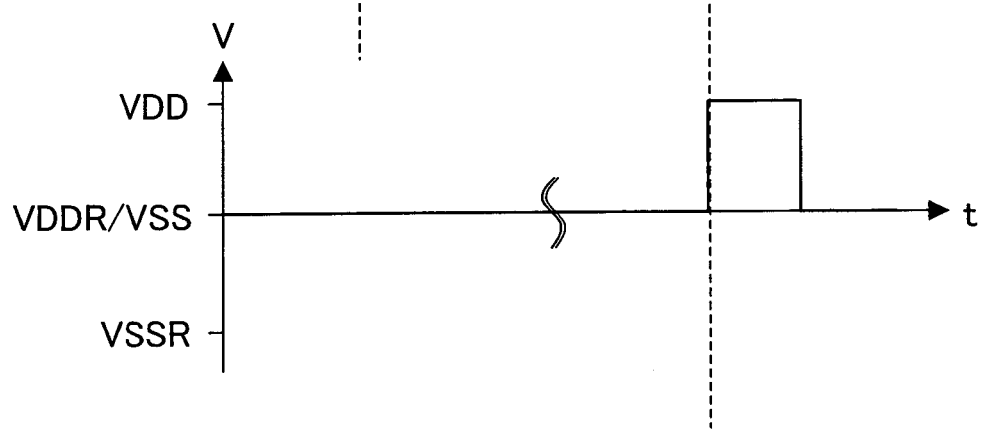

FIG. 8 illustrates a sensor element of an image sensor which requires only one transistor M1 and thus occupies an even smaller substrate area, permitting even greater image sensing spatial resolution and/or display aperture ratio. The source-follower transistor M1 and the biasing transistor M3 are as described hereinbefore. The cathode of the photodiode D1 and the first electrode (terminal) of the integrating capacitor C1 are connected to the integrating node 11 and to the gate of the transistor M1. The anode of the photodiode D1 is connected to the reset line RST. The second electrode (terminal) of the capacitor C1 is connected to the row select line RS and the transistor M2 is omitted. The waveforms on the resetting line RST and on the row select RS are illustrated by the upper and lower waveforms shown in FIG. 9.

As described hereinbefore, the sensor elements perform a repeating cycle of resetting, integrating and reading phases. The cycles are synchronised with each other for the sensor elements 10 in the same row and the cycles for different rows are staggered or offset in time, for example in accordance with known active matrix addressing techniques.

At the start of the resetting phase, the signal on the resetting line RST rises to its higher level of $V_{DDR}$. The photodiode D1 thus becomes forward-biased and conducts so as to charge the integration mode 11 to a potential of $(V_{DDR}-V_D)$, where $V_D$ is the forward voltage of the photodiode. The voltage $V^{DDR}$ is less than the threshold voltage of the transistor M1 so that this transistor remains switched off during the resetting phase and during the subsequent integrating phase.

The integrating phase begins when the resetting signal returns to its low value. During this phase, the photodiode current discharges the integration capacitor C1 at a rate proportional to the photon flux incident on the photodiode. At the end of the integration phase (when the row is selected for reading), the voltage $V_{INT}$ at the integrating node 11 is given by:

$$V_{INT}=V_{DDR}-V_D-I_{PHOTO} \cdot t_{INT}/C_T$$

where $I_{PHOTO}$ is the current through the photodiode D1, $t_{INT}$ is the integration time period and $C_T$ is the total capacitance at the integrating node 11. The total capacitance $C_T$ is the total of the capacitance of the capacitor $C_1$, the self-capacitance of the photodiode D1 and the gate capacitance of the transistor M1.

At the start of the reading phase, the row select signal on the line RS rises to its higher value. Charge injection occurs across the integrating capacitor C1 such that the potential at the integrating node 11 is increased to:

$$V_{INT}=V_{DDR}-V_D-I_{PHOTO} \cdot t_{INT}/C_T+(V_{RS.H}-V_{RS.L}) \cdot C_{INT}/C_T$$

where $V_{RS.H}$ and $V_{RS.L}$ are the high and low potentials, respectively, of the row select signal and may be equal to $V_{DD}$ and $V_{SS}$, respectively.

The potential at the integrating node 11 thus rises above the threshold voltage of the source-follower transistor M1 such that it operates, together with the bias transistor M3 at the end of the column, as a source-follower amplifier. The output voltage supplied to the column output represents the photodiode current integrated during the integration phase and so represents the intensity of light incident on the photodiode D1.

At the end of the reading phase, the row select signal on the line RS returns to its low value. Charge is removed from the integrating node 11 by charge injection across the capacitor C1. The potential of the integrating node 11 thus drops below the threshold voltage of the transistor M1, which is thus turned off.

As mentioned hereinbefore, the second terminal of the capacitor C1 is connected to the supply line (second control input) VDD in the form of the row select line RS. During the sensing or integrating phase, the row select line RS receives a voltage (third voltage) VDDR/VSS, which disables the amplifying element M1 and permits integration of the photocurrent. During the reading phase at the end of the integration period, as shown in the lower graph of FIG. 9, the row select line RS receives the voltage (fourth voltage) $V_{DD}$, which enables the transistor M1 by causing, by charge injection, the gate of the transistor M1 to rise above the transistor threshold voltage to a voltage determined at least in part by the light incident on the photodiode D1 during the integration period.

As mentioned hereinbefore, the substrate area occupied by the sensor element 10 of FIG. 8 is even less than that of the previously described embodiments by the omission of the row select transistor M2.

Figure 10:
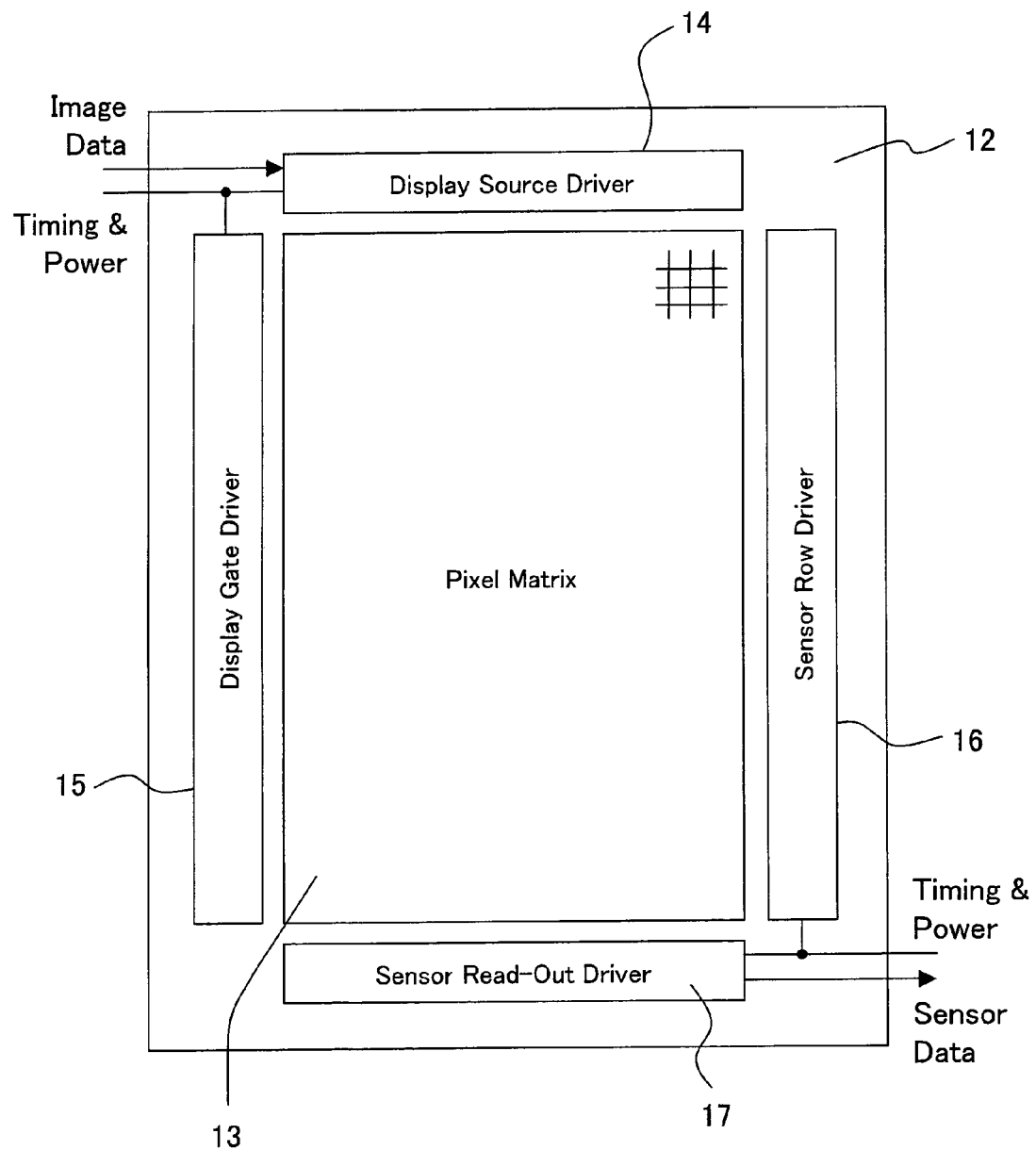
FIG. 10 is a schematic diagram illustrating a display constituting an embodiment of the invention including an image sensor.

As mentioned hereinbefore, the array of sensor elements 10 and the output circuitry at the bottom of the columns may be incorporated within a display so as to provide such a display with an input facility, for example in the form of a "touch screen". FIG. 10 illustrates the layout of such a device on a common substrate, on which all of the components are integrated, for example by thin-film technology or silicon-on-insulator technology. A transparent substrate 12, for example made of glass, carries a pixel matrix 13 comprising an array or matrix of display picture elements (pixels) including the sensor elements, together with appropriate electrodes extending in the row and column directions. The display receives image data together with timing signals and power from any suitable image source and comprises a display source driver 14 and a display gate driver 15. Such drivers are known in the field of active matrix devices and will not therefore be described further. The device also comprise a sensor row driver 16 and a sensor read-out driver 17. The drivers 16 and 17 receive timing and power signals from apparatus for processing the sensor data. The sensor read-out driver 17 may be of conventional type as described hereinbefore and the sensor row driver 16 may be similar to the display gate driver 15.

Figure 11:
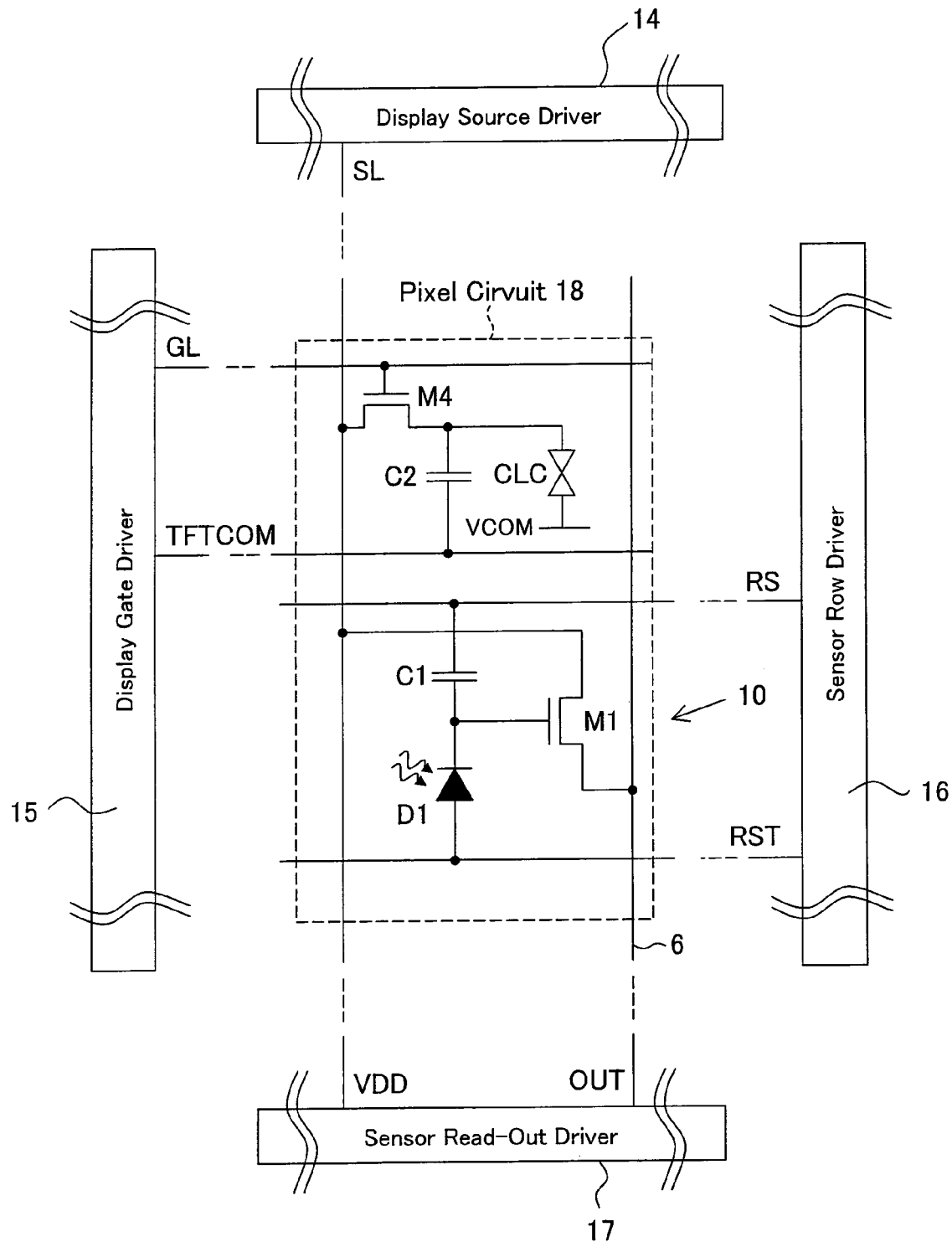
FIG. 11 is a diagram illustrating a detail of an example of the embodiment shown in FIG. 10.

FIG. 11 illustrates an example of the combined display and sensor arrangement of FIG. 10 in the form of an active matrix liquid crystal display (AMLCD) including the image sensing function. The circuit diagram of one of the pixel circuits 18 forming the array is shown in detail. The display pixel is of known type and comprises a thin-film insulated gate field effect transistor M4 whose gate is connected via a row gate line GL to the display gate driver 15 and whose source is connected via a column source line SL to the display source driver 14. The drain of the transistor M4 is connected to one electrode of a capacitor C2 and to one electrode of a liquid crystal pixel CLC. The other electrode of the capacitor C2 is connected via a common line TFTCOM to the driver 15. The other pixel electrode is constituted by a counter-electrode on the opposite device substrate connected to receive a common counter-electrode voltage VCOM.

The sensor element 10 is of the type illustrated in FIG. 8 and comprises the single transistor M1, the thin-film lateral photodiode D1 and the integrating capacitor C1. The supply line VDD and the column output line 6 are connected to the sensor read-out driver 17. The row select line RS and the reset line RST are connected to the sensor row driver 16.

The operation of the image display pixels in such an AMLCD is well-known and will not be described further. The operation of the image sensor comprising the sensor elements 10 and the drivers 16 and 17 is as described hereinbefore. Although the addressing of the display pixels and the sensor elements may be performed independently, such addressing is generally synchronised on a row-by-row basis and an example of the timing of such addressing is described hereinafter.

Figure 4:
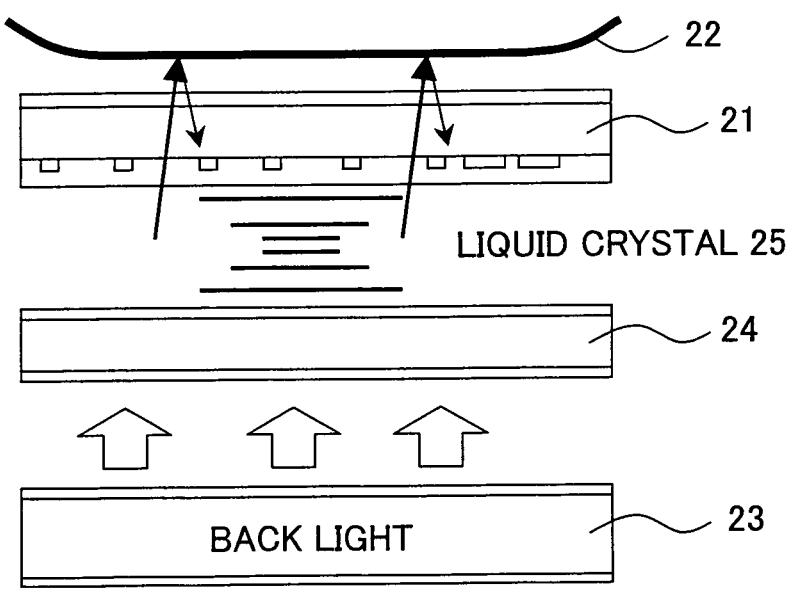
FIG. 4 is a schematic cross-sectional diagram of a known display including an image sensor operating in reflection mode.
Figure 12:
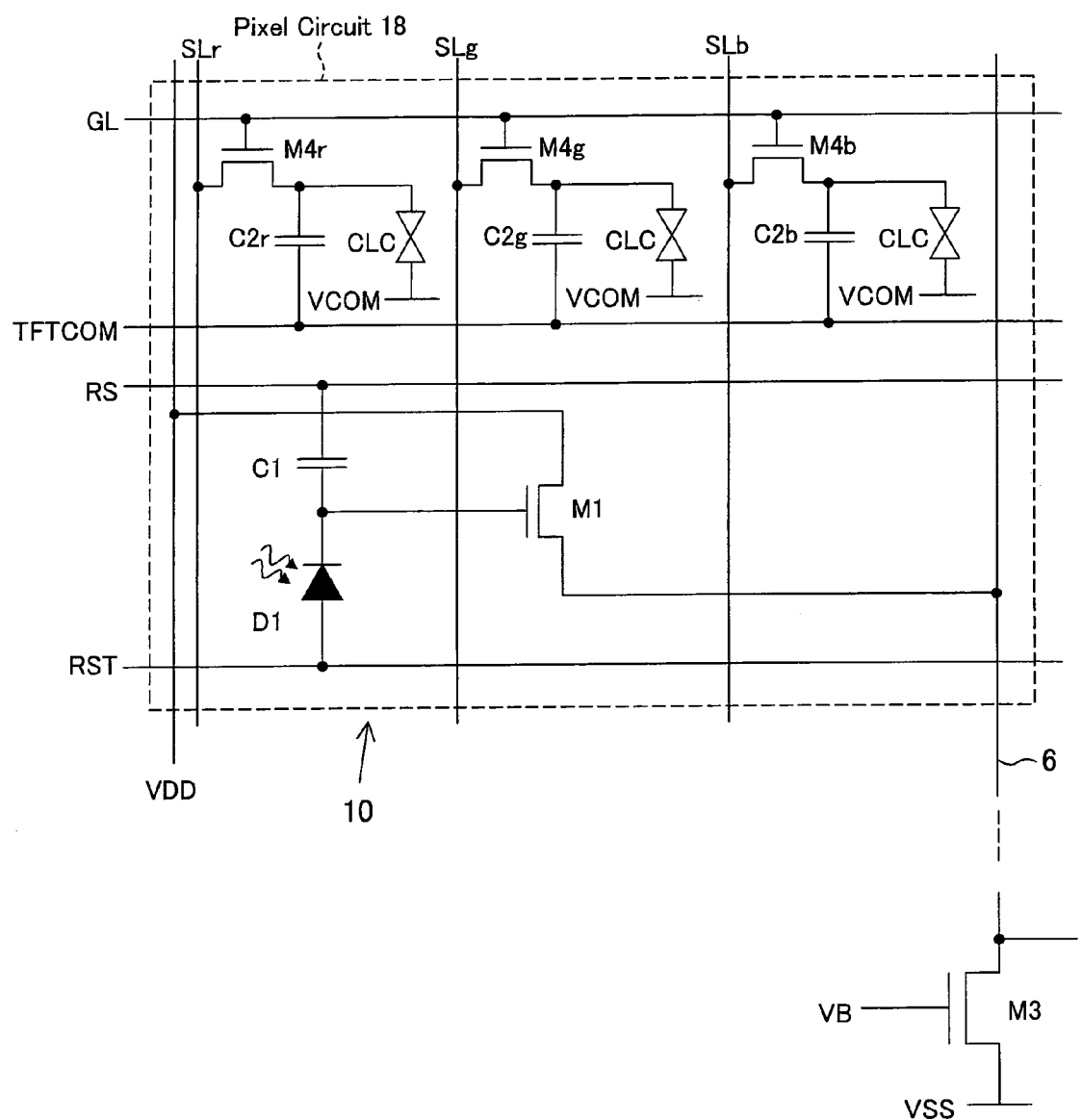
FIG. 12 is a diagram illustrating a detail of another example of the embodiment shown in FIG. 10.

In the display of FIG. 11, each sensor element 10 is disposed within each pixel circuit 18 so that the image sensing spatial resolution is the same as the image display spatial resolution. However, the sensing and display resolutions need not be the same and each may be chosen according to the needs of any particular application. For example, FIG. 12 illustrates a display in which one sensor element 10 is provided for each set of three colour component pixels forming a composite full-colour pixel. Separate source lines SLr, SLg and SLb are provided for the RGB component pixels of each column of composite pixels. The photodiode D1 and the integrating capacitor C1 are disposed within one of the colour component pixels, in this case the red pixel, whereas the transistor M1 is disposed within the green colour component pixel. This reduces the area occupied by the sensor element circuitry within each colour component pixel and thus increases the lowest pixel aperture ratio. Locating the photodiodes D1 under colour component pixels of one colour would make the image sensor sensitive to monochromatic light of that colour. This may be avoided by locating the photodiodes under different colour filter colours across the device or by operating the device with the active matrix substrate uppermost, for example as illustrated in FIG. 4. In the arrangement of FIG. 4, ambient light does not pass through the display colour filtering before being incident on the photodiodes.

Figure 13:
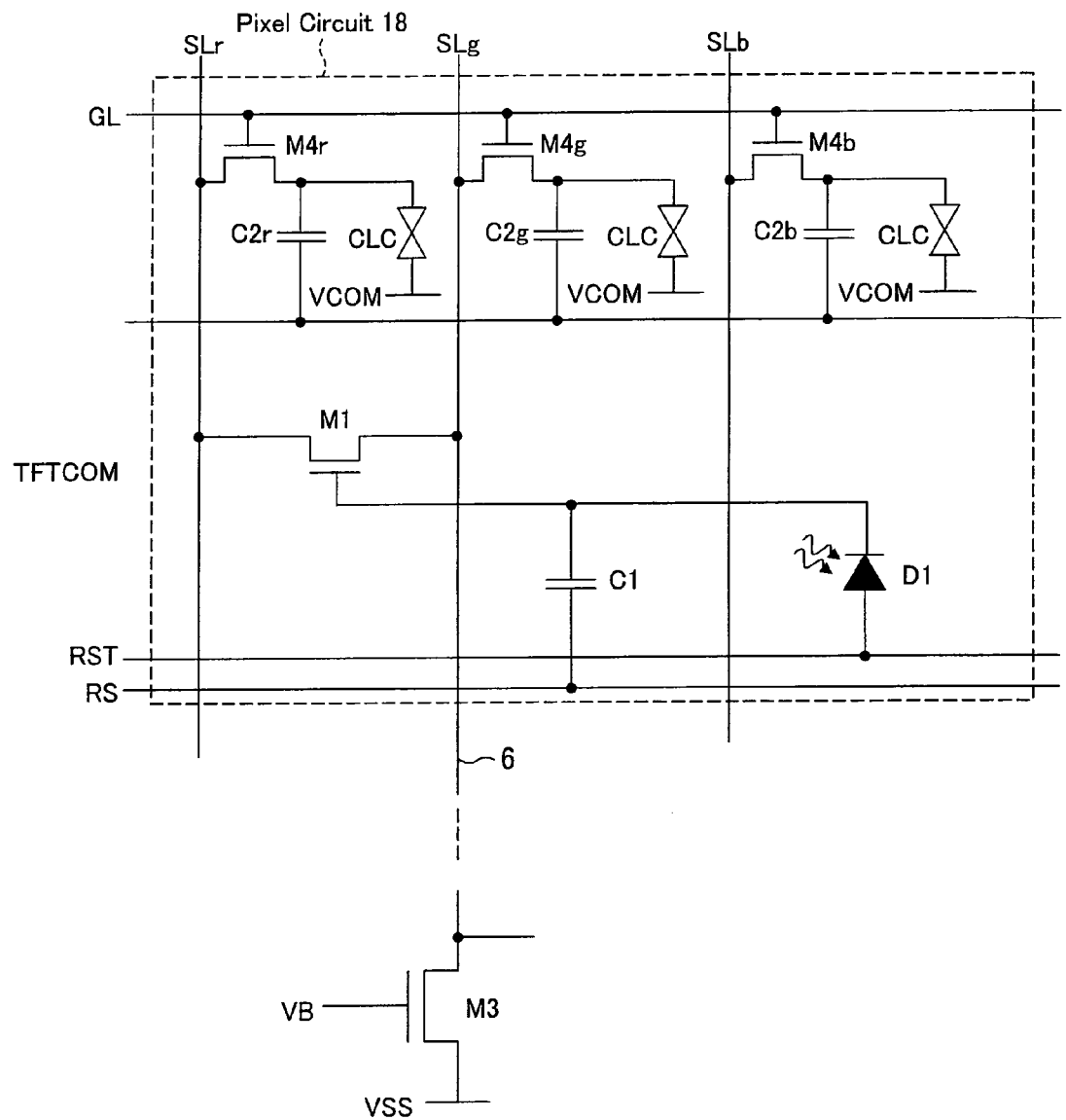
FIG. 13 is a diagram illustrating a detail of a further example of the embodiment shown in FIG. 10.

FIG. 13 illustrates a display which differs from that of FIG. 12 in that the source lines are also used as the column output lines 6 of the image sensor so as to increase even further the lowest pixel aperture ratio. Because of the sharing of the lines as source lines and column output lines, it is necessary for addressing or scanning of the image display pixels and the sensor elements to be performed with the appropriate timing and an example of such timing is illustrated in the waveform diagram of FIG. 14. The reading phase of each sensor element row need only be performed for a relatively small portion of the total row addressing time of each row and this may be arranged to coincide with the horizontal blanking period of the display function, during which time the source lines are normally disconnected from the display source driver 14.

Figure 14:
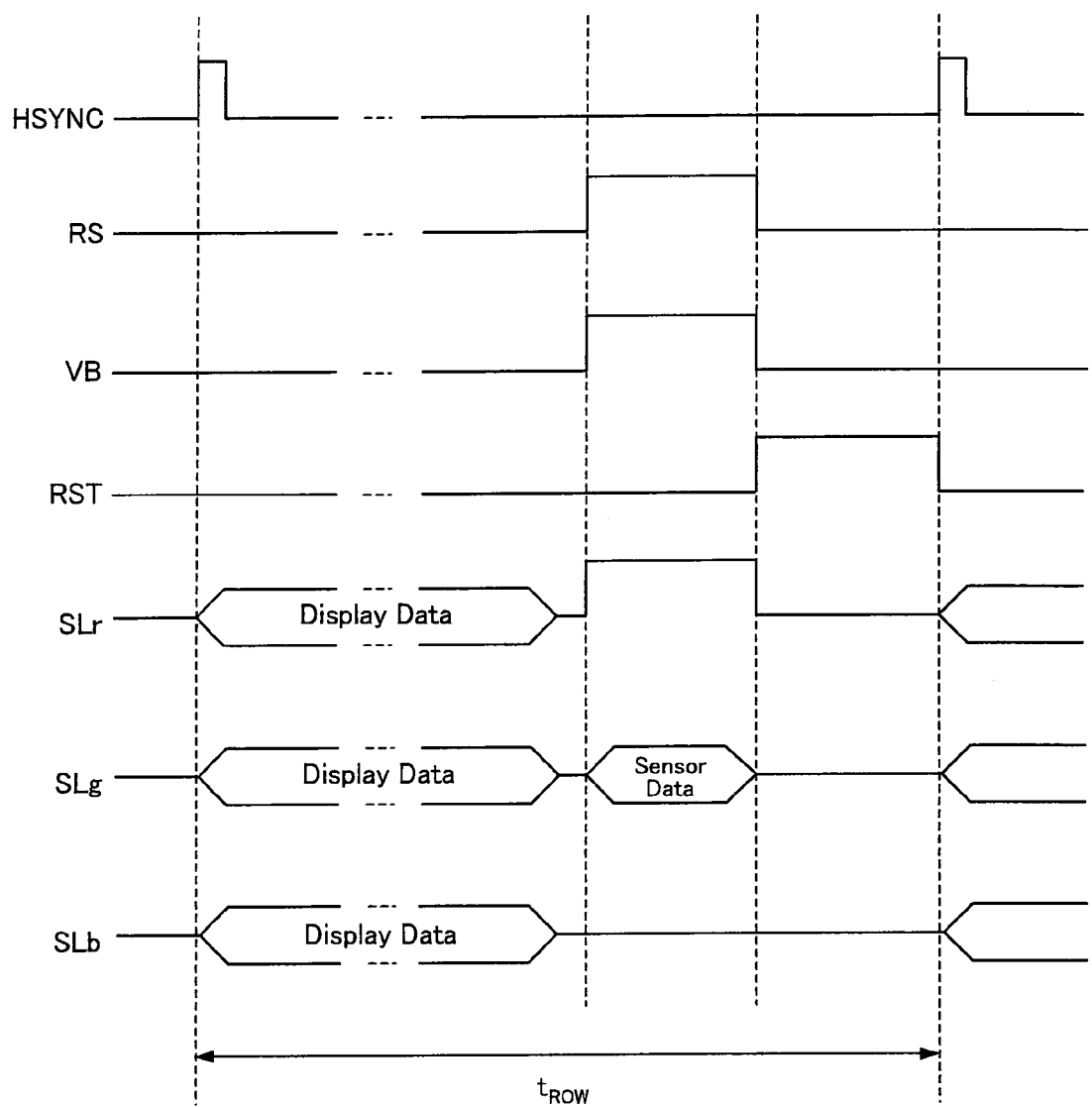
FIG. 14 is a timing diagram illustrating operation of the embodiment shown in FIG. 10.

As illustrated in FIG. 14, each display row period starts with a horizontal sync pulse HSYNC, after which the source lines SLr, SLg and SLb are driven with suitable voltages in order to control the optical states of the colour component pixels of the selected row so as to refresh the image row-by-row as in known addressing schemes.

Following signal transfer to the image display pixels of the row, the source lines are disconnected from the display source driver 14 at the start of the blanking period, which is commonly used in known AMLCDs to invert the polarity of the counter-electrode so as to prevent degradation of the liquid crystal material. During the blanking period, the sensor element row select signal rises on the line RS and the bias voltage VB is applied to the transistors M3 to which the column output lines 6 are connected so as to enable the source-follower arrangement in the image elements of the currently selected row. The sensor data are thus output via the column lines SLg to the sensor read-out driver 17, which acts as an interface between the sensor elements 10 and the sensor output of the device.

At the end of the reading phase of the selected row of sensor elements, the row select and bias signals return to their low potential. A resetting signal is applied to the reset line RST for the sensor elements of the selected row so as to reset the integrating nodes to the predetermined voltage. The resetting signal is then removed at the end of the row addressing period $t_{ROW}$ and the process is then repeated for the next pixel row.

The arrangement illustrated in FIG. 13 gives one example of spreading the sensor element components across a plurality of pixels to increase the lowest pixel aperture ratio and of sharing common lines to reduce the area occupied by the sensor element and thus increase the aperture ratio of the display. However, the components of the sensor elements may be arranged in any other suitable manner across the display pixels. Also, other common line sharing arrangements are possible.

The invention claimed is:

1. An image sensor comprising at least one sensor element, each of the at least one sensor element comprising a semiconductor amplifying element, an integrating capacitor, and a photodiode having a first electrode, which is connected to a first control electrode of the amplifying element and a first terminal of the capacitor, and a second electrode connected to a first control input, which is arranged to receive, during a sensing phase, a first voltage for reverse-biasing the photodiode and to receive, during a resetting phase, a second voltage for forward-biasing the photodiode so as to charge the capacitor to a predetermined voltage.

2. A sensor as claimed in claim 1, in which the resetting and sensing phases are repeated cyclically.

3. A sensor as claimed in claim 1, in which the photodiode is a lateral photodiode.

4. A sensor as claimed in claim 1, in which the photodiode is a thin film diode.

5. A sensor as claimed in claim 1, in which the amplifying element comprises a voltage-follower arrangement.

6. A sensor as claimed in claim 1, in which the amplifying element comprises a first transistor.

7. A sensor as claimed in claim 6, in which the first transistor is a thin film transistor.

8. A sensor as claimed in claim 6, in which the first transistor is a field effect transistor.

9. A sensor as claimed in claim 5, in which the first transistor is a field effect transistor, the first transistor is connected as a source-follower and the first control electrode comprises the transistor gate.

10. A sensor as claimed in claim 1, comprising a semiconductor selection element having a main conductive path connected in series with that of the amplifying element and a second control electrode connected to a second input for controlling selection of the sensor element during a reading phase.

11. A sensor as claimed in claim 10, in which the selection element comprises a second transistor.

12. A sensor as claimed in claim 11, in which the second transistor is a thin film transistor.

13. A sensor as claimed in claim 1, in which the capacitor has a second terminal connected to a second control input, which is arranged to receive, during the sensing phase, a third voltage for disabling the amplifying element and for permitting integration by the capacitor of a photocurrent from the photodiode and to receive, during a reading phase, a fourth voltage for enabling the amplifying element.

14. A sensor as claimed in claim 1, in which the at least one sensor element comprises a plurality of sensor elements arranged as a first array comprising rows and columns.

15. A sensor as claimed in claim 14, comprising first row control inputs, each of which is connected to the first control inputs of the sensor elements of a respective row.

16. A sensor as claimed in claim 14, comprising: a semiconductor selection element having a main conductive path connected in series with that of the amplifying element; a second control electrode connected to a second input for controlling selection of the sensor element during a reading phase; and second row control inputs, each of which is connected to the second control inputs of the sensor elements of a respective row.

17. A sensor as claimed in claim 14, comprising column outputs, each of which is connected to outputs of the sensor elements of a respective column.

18. A sensor as claimed in claim 17, in which each column is connected to a respective biasing element.

19. A sensor as claimed in claim 18, in which each biasing element comprises a third transistor.

20. A sensor as claimed in claim 19, in which each third transistor is a thin film transistor.

21. A sensor as claimed in claim 14, comprising an active matrix addressing arrangement for addressing the sensor elements.

22. A display comprising a sensor as claimed in claim 1 and at least one display pixel.

23. A display as claimed in claim 22, in which the at least one sensor element comprises a plurality of sensor elements arranged as a first array comprising rows and columns, and the at least one pixel comprises a plurality of pixels arranged as a second array comprising a plurality of the rows and a plurality of the columns.

24. A display as claimed in claim 23, in which each of the sensor elements forms part of at least one pixel.

25. A display as claimed in claim 23, in which the sensor comprises column outputs, each of which is connected to outputs of the sensor elements of a respective column, the display comprising pixel column data lines, at least two of which connect the column outputs to the sensor elements of the respective columns.

26. A display as claimed in claim 23, in which the pixels are liquid crystal pixels.

27. A display as claimed in claim 23, in which the sensor comprises an active matrix addressing arrangement for addressing the sensor elements, the active matrix addressing arrangement is being arranged to address each row of sensor elements during a line blanking period of a corresponding row of pixels.

* * * * *